(12) United States Patent
Choi et al.

(10) Patent No.: US 7,834,360 B2
(45) Date of Patent: Nov. 16, 2010

(54) THIN FILM TRANSISTOR ARRAY SUBSTRATE

(75) Inventors: Seungjin Choi, Beijing (CN); Youngsuk Song, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 78 days.

(21) Appl. No.: 12/126,253

(22) Filed: May 23, 2008

(65) Prior Publication Data

US 2009/0085034 A1    Apr. 2, 2009

(30) Foreign Application Priority Data

Sep. 27, 2007   (CN) .................... 2007 1 0175204

(51) Int. Cl.
    *H01L 27/14*     (2006.01)
(52) U.S. Cl. ................... 257/72; 257/59; 257/258; 257/E27.1
(58) Field of Classification Search ............. 257/59, 257/72, 258, E27.1
    See application file for complete search history.

(56) References Cited

U.S. PATENT DOCUMENTS 6,630,976 B2    10/2003   Ahn et al.
7,471,351 B2 *  12/2008   Choi ..................... 349/54

FOREIGN PATENT DOCUMENTS

KR    2001-0060584 A    7/2001

* cited by examiner

*Primary Examiner*—Tan N Tran
(74) *Attorney, Agent, or Firm*—Ladas & Parry, LLP

(57) ABSTRACT

The present invention relates to a thin film transistor array substrate comprising a gate line and a data line that are separated by an insulting layer and intersecting each other to define a pixel, wherein a data auxiliary line is disposed adjacent to an intersection portion between the data line and the gate line, and both ends of the data auxiliary line are on two sides of the intersection portion and connected with the data lines, respectively.

15 Claims, 3 Drawing Sheets

THIN FILM TRANSISTOR ARRAY SUBSTRATE

BACKGROUND

The present invention relates to a thin film transistor (TFT) array substrate of a liquid crystal display (LCD).

A plurality of data lines and gate lines perpendicularly intersecting each other are disposed on a TFT array substrate of a LCD. The gate lines are disposed below an insulating layer, and the data lines are disposed above the insulating layer. Some foreign particles introduced in the process of fabricating the array substrate may cause short circuit between the gate lines and the data lines, and in addition, electrostatic charge of several hundreds thousands voltage tends to be induced around the gate lines and the data lines so as to cause short circuit between the gate lines and the data lines. The step formed at the intersections portion of the gate lines and the data lines may render the data lines susceptible to break; therefore, the intersection portion may be not as robust as other portions on the substrate and easily result in a failure. All the above may degrade the product quality and even cause waste. In the producing process, the undesired phenomena need to be avoided so as to improve the efficiency and yield.

FIGS. 1 and 2 show the design of a conventional TFT array substrate. A compensate line 12 is designed around a array substrate 11 in advance, and when a data line 13 intersecting a gate line 14 is broken, the data line 13 can be connected with the compensate line 12, so that the signal can be transmitted to the display panel properly.

In the above design of the conventional TFT array substrate, when certain undesirable phenomenon arises on one data line, the failure cannot be repaired by the above method; a limited number of the compensate lines 12 can be formed around the array substrate 11, and if the undesirable phenomena exceed a certain range, there are no enough compensate lines to completely repair the data lines on which a failure occur.

SUMMARY

In an embodiment according to the present invention, there is provided a thin film transistor (TFT) array substrate, comprising a gate line and a data line that are separated by an insulting layer and intersecting each other to define a pixel, wherein a data auxiliary line is disposed adjacent to an intersection portion between the data line and the gate line, and both ends of the data auxiliary line are on two sides of the intersection portion and connected with the data lines, respectively.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Exemplary embodiments of the present invention will be described hereinafter with reference to the accompanying drawings. It should be understood that in this description when a layer or a element is referred to as being "on" or "connected to" another layer or element, this layer or element can be directly on or directly connected to the other layer or element, or an intervening layer may also be present.

The First Embodiment

Figure 1:
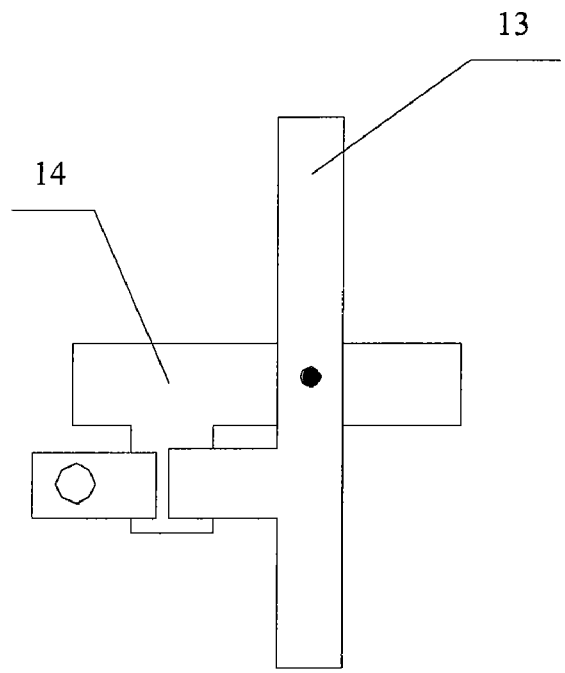
FIG. 1 is a schematic plan view showing a conventional TFT array substrate.
Figure 2:
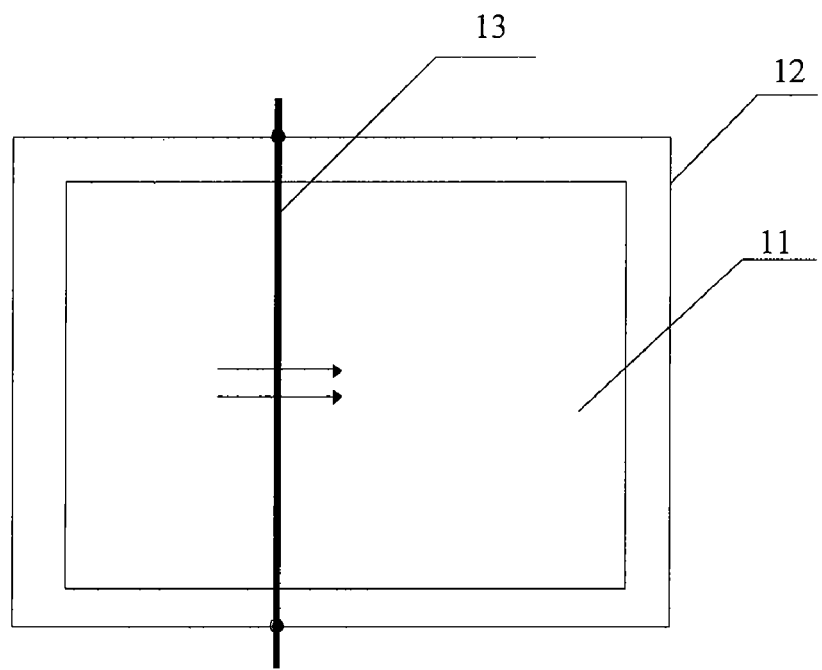
FIG. 2 is a schematic plan view of connecting a data line with a compensate line in the conventional TFT array substrate.
Figure 3:
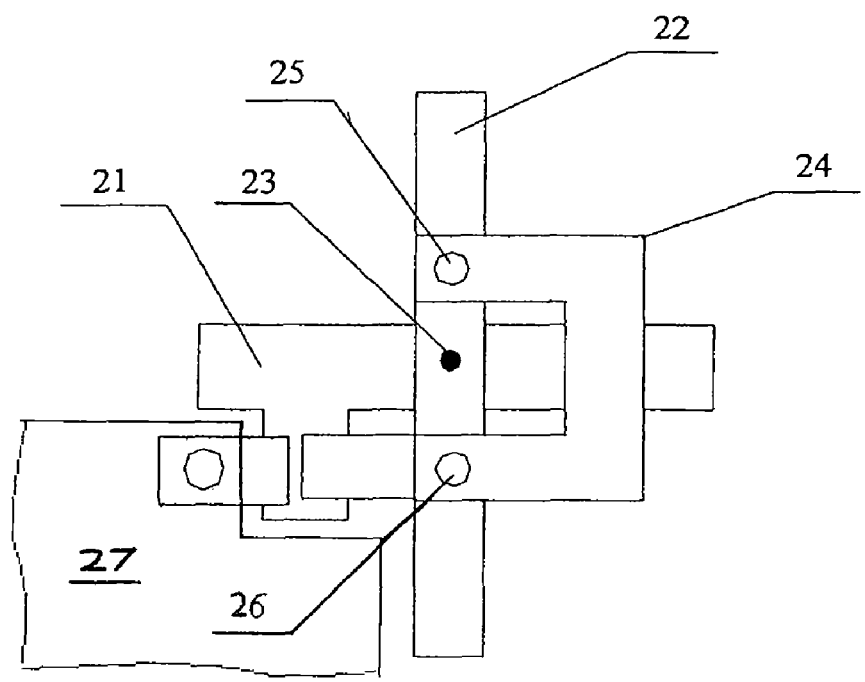
FIG. 3 is a partial schematic plan view of a TFT array substrate according to a first embodiment of the present invention.

FIG. 3 is a partial schematic plan view of a TFT array substrate according to a first embodiment of the present invention. The TFT array substrate of the present embodiment includes a gate line 21, a data line 22, a data auxiliary line 24, and a pixel electrode 27, which are formed on a glass substrate for example. The gate line and the data line intersect each other to define a pixel. In FIG. 3, reference "T" refers to a thin film transistor (TFT) on the array substrate, which is used as a switch element of the pixel for displaying images. The gate line 21 is separated from the date line 22 by an insulting layer (not shown in the plan view), that is, the gate line 21 is disposed below the insulting layer, and the data line 22 is disposed above the insulting layer. The data auxiliary line 24 is disposed adjacent to the intersection portion between the data line 22 and the gate line 21, in particular, for example on a side opposite to the thin film transistor T with respect to the data line 22. The data auxiliary line 24 is formed of the same material as the pixel electrode 27 and is formed on the same layer as the pixel electrode 27.

In the embodiment, a passivation layer is formed between the pixel electrode 27 and the data line 22, that is, the passivation layer is formed on the data line and the pixel electrode 27 is formed on the passivation layer. During forming the passivation layer in the process of fabricating the array substrate, a first via hole 25 and a second via hole 26 are formed in the passivation layer. These two via holes are respectively located at the both sides of the intersection portion between the data line 22 and the gate line 21 with respect to the gate line 21 and also located on the data line 22. When the pixel electrode 27 is formed above the passivation layer, the data auxiliary line 24 is formed on a side of the intersection portion between the data line 22 and the gate line 21, and the both ends of the data auxiliary line 24 are respectively connected with the data line 22 via the first via hole 25 and the second via hole 26 which pass through the passivation layer.

In the embodiment, when the data line 22 is broken or short circuit 23 arises at the intersection portion between the data line 22 and the gate line 21, since the data auxiliary line 24 is connected with the data line 22, the signal can be input normally by the data auxiliary line 24 while the data line 22 is broken at the intersection portion between the data line 22 and the gate line 21, or in the case of short circuit 23, the data line 22 can be cut off at the intersection portion between the data line 22 and the gate line 21, and then the signal can also be input normally by the data auxiliary line 24, so that the failure can be overcome and the quality of the product can be improved.

The Second Embodiment

Figure 4:
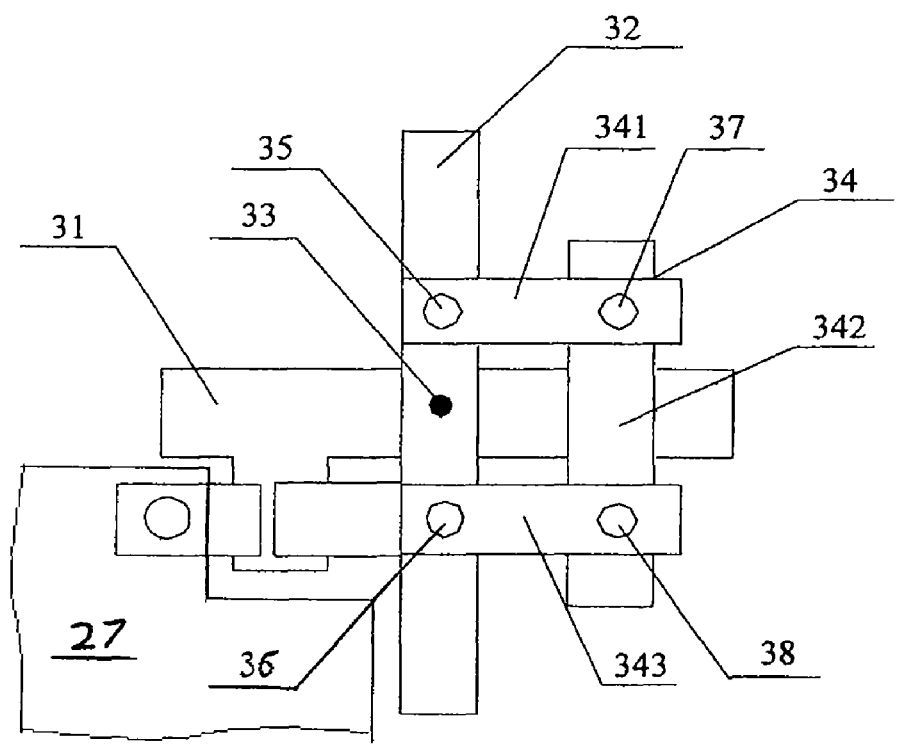
FIG. 4 is a partial schematic plan view of a TFT array substrate according to a second embodiment of the present invention.

FIG. 4 is a partial schematic plan view of a TFT array substrate according to a second embodiment of the present invention. The TFT array substrate of the present embodiment includes a gate line 31, a data line 32, a data auxiliary line 34, and a pixel electrode 27, which are formed on a glass substrate for example. The gate line and the data line intersect with each other to define a pixel, and reference "T" refers to a thin film transistor on the array substrate, which is used as a switch element of the pixel for displaying images. The gate line 31 is separated from the date line 32 by an insulting layer (not shown in the plan view), that is, the gate line 31 is disposed below the insulting layer, and the data line 32 is disposed above the insulting layer. The data auxiliary line 34 is disposed adjacent to the intersection portion between the data line 32 and the gate line 31, in particular, for example on a side opposite to the thin film transistor T with respect to the data line 32. The data auxiliary line 34 comprises a first connecting line 341, a second connecting line 342, and a third connecting line 343, which are connected sequentially. A passivation layer is formed on the data line 32 and the second connecting line 342; the pixel electrode 27, the first connecting line 341, and the third connecting line 343 are formed on the passivation layer. The first connecting line 341 and the third connecting line 343 are formed of the same material as the pixel electrode 27 and are formed on the same layer as the pixel electrode 27. The second connecting line 342 is formed of the same material as the data line 32 and is formed on the same layer as the data line 32.

In the present embodiment, during forming the data line in the process of fabricating the array substrate, the second connecting line 342 is disposed adjacent to the intersection portion between the data line 32 and the gate line 31; during forming the passivation layer, a first via hole 35 and a second via hole 36 are formed in the passivation layer, and these two via holes are respectively located at the both sides of the intersection portion between the data line 32 and the gate line 31 with respect to the gate line 31 and also on the data line 32. A third via hole 37 and a fourth via hole 38 are also formed in the passivation layer, these two via holes are respectively located at the both ends of the second connecting line 342 with respect to the gate line 31 and also located on the second connecting line 342. During forming the pixel electrode 27 above the passivation layer, both of the first connecting line 341 and the third connecting line 343 are disposed perpendicular to the data line 32. The second connecting line 342 has an island structure, runs parallel to the data line 32, and is not connected with the other data lines. The first connecting line 341 and the third connecting line 343 have respective ends connected with the second connecting line 342 respectively via the third via hole 37 and the fourth via hole 38 which pass through the passivation layer, and the first connecting line 341 and the third connecting line 343 have the other ends connected with the data line 32 respectively via the first via hole 35 and the second via hole 32 which pass through the passivation layer.

In the embodiment, when the data line 32 is broken or short circuit 33 arises at the intersection portion between the data line 32 and the gate line 31, since the data auxiliary line 34 is connected with the data line 32, the signal can be input normally by the data auxiliary line 34 if the data line 32 is broken at the intersection portion between the data line 32 and the gate line 31, or in the case of short circuit 33, the data line 32 can be cut off at the intersection portion between the data line 32 and the gate line 31, and then the signal can also be input normally by the data auxiliary line 34, so that the failure can be overcome and the quality of the product can be improved.

The Third Embodiment

Figure 5:
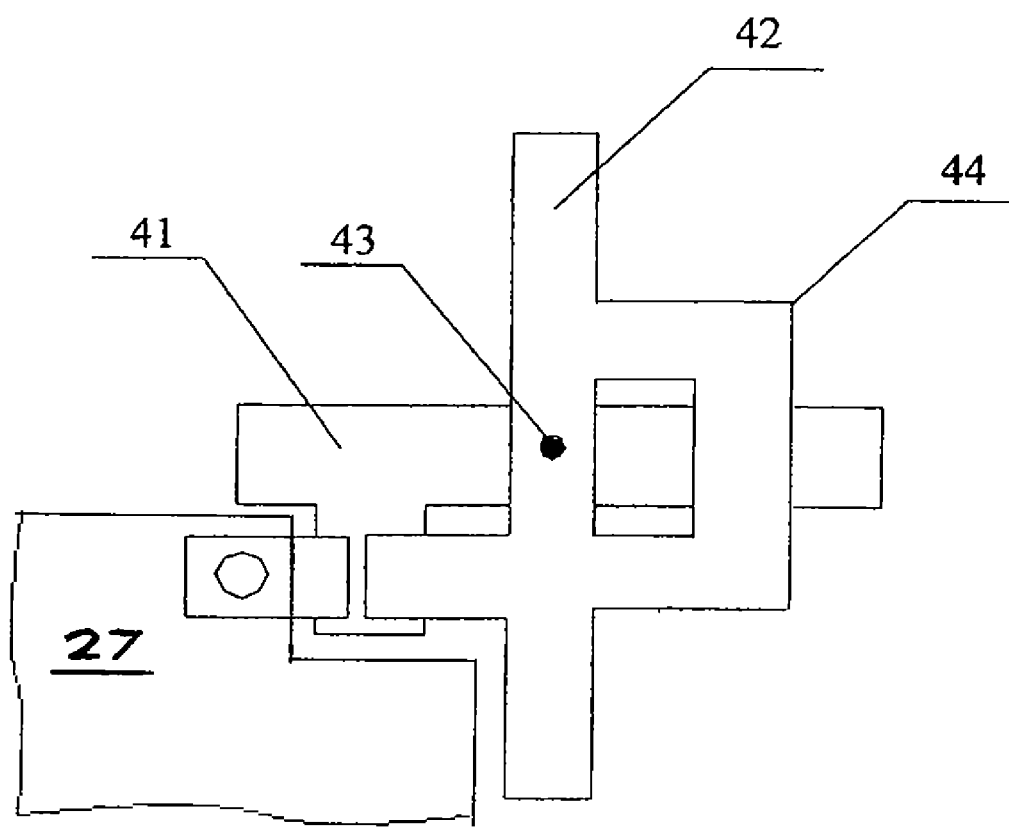
FIG. 5 is a partial schematic plan view of a TFT array substrate according to a third embodiment of the present invention.

FIG. 5 is a partial schematic plan view of a TFT array substrate according to a third embodiment of the present invention. The TFT array substrate of the present embodiment includes a gate line 41, a data line 42, a data auxiliary line 44, and a pixel electrode 27, which are formed on a glass substrate for example. The gate line and the data line intersect with each other to define a pixel, and reference "T" refers to a thin film transistor on the array substrate, which is used as a switch element of the pixel for displaying images. The gate line 41 is separated from the date line 42 by an insulting layer, that is, the gate line 41 is disposed below the insulting layer, and the data line 42 is disposed above the insulting layer. The data auxiliary line 44 is disposed adjacent to the intersection portion between the data line 42 and the gate line 41, both ends of the data auxiliary line 44 are connected with the data line 42, and the connecting points are disposed on the two sides of the data line 42 with respect to the gate line 41. The data auxiliary line 44 is formed of the same material as the data line 42 and is formed on the same layer as the data line 42.

During forming the data line 42 in the process of fabricating the array substrate, the data auxiliary line 44 is disposed adjacent to the intersection portion between the data line 42 and the gate line 41 and is formed along with the data line 42. When the data line 42 is broken or short circuit 43 arises at the intersection portion between the data line 42 and the gate line 41, since the data auxiliary line 44 is connected with the data line 42, the signal can be input normally by the data auxiliary line 44 while the data line 42 is broken at the intersection portion between the data line 42 and the gate line 41; further, in the case of short circuit 43, the data line 42 can be cut off at the intersection portion between the data line 42 and the gate line 41, and then the signal can also be input normally by the data auxiliary line 44. Thus, the failure can be overcome and the quality of the product can be improved.

In the TFT array substrates according to the embodiments, the undesirable problems such as short circuit and the break of data line, which are generated at the intersection portion between a gate line and a data line, can be overcome by disposing a data auxiliary line on a side of the intersection portion, connecting the data auxiliary line with the data line that is subject to the problem, cutting off the data line located at the intersection portion, and performing the repairs, so that the quality of the product can be improved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor (TFT) array substrate, comprising:
a gate line and a data line that are insulated and separated from each other and intersecting each other to define a pixel,
wherein a data auxiliary line is disposed adjacent to an intersection portion between the data line and the gate line, and both ends of the data auxiliary line are on two sides of the intersection portion and connected with the data line, and
wherein the data auxiliary line is formed along with the data line, with a same material as the data line and on a same layer as the data line.

2. The TFT array substrate according to claim 1, wherein the data auxiliary line is disposed on a side opposite to a thin film transistor of the pixel with respect to the data line.

3. A thin film transistor (TFT) array substrate, comprising:
a gate line and a data line that are insulated and separated from each other and intersecting each other to define a pixel; and
a pixel electrode formed above the data line and separated from the data line,
wherein a data auxiliary line is disposed adjacent to an intersection portion between the data line and the gate line, and both ends of the data auxiliary line are on two sides of the intersection portion and connected with the data line, and
wherein the data auxiliary line is formed along with the pixel electrode, with a same material as the pixel electrode and on a same layer as the pixel electrode.

4. The TFT array substrate according to claim 3, wherein the data auxiliary line is connected with the data line by two via holes at two ends of the data auxiliary line.

5. A thin film transistor (TFT) array substrate, comprising:
a gate line and a data line that are insulated and separated from each other and intersecting each other to define a pixel; and
a pixel electrode formed above the data line and separated from the data line,
wherein a data auxiliary line is disposed adjacent to an intersection portion between the data line and the gate line, and both ends of the data auxiliary line are on two sides of the intersection portion and connected with the data line,
wherein the data auxiliary line comprises a first connecting line, a second connecting line, and a third connecting line which are connected sequentially, and
wherein the second connecting line is formed along with the data line, with a same material as the data line and on a same layer as the data line, and the first connecting line and the third connecting line are formed along with the pixel electrode, with a same material as the pixel electrode and on a same layer as the pixel electrode.

6. The TFT array substrate according to claim 5, wherein the first connecting line and the third connecting line are connected with data line via a first via hole and a second via hole, respectively, and are connected with the second connecting line respectively via a third via hole and a fourth via hole.

7. A third film transistor (TFT) array substrate, comprising:
a gate line and a data line that are insulated and separated from each other and intersecting each other to define a pixel, and
a pixel electrode formed above the data line and separated from the data line,
wherein a data auxiliary line is disposed adjacent to an intersection portion between the data line and the gate line, the data auxiliary line comprising fist, second and third connecting lines which are connected sequentially, the first and third connecting lines being on two sides of the intersection portion and connected with the data line, and
wherein the first, second and third connecting lines of the data auxiliary line are formed along with the pixel electrode, with a same material as the pixel electrode and on a same layer as the pixel electrode.

8. The TFT array substrate according to claim 7, wherein the data auxiliary line is connected with the data line by two via holes at two ends of the data auxiliary line.

9. A thin film transistor (TFT) array substrate, comprising:
a gate line and a data line that are insulated and separated from each other and intersecting each other to define a pixel; and
a pixel electrode formed above the data line and separated from the data line,
wherein a data auxiliary line is disposed adjacent to an intersection portion between the data line and the gate line, the data auxiliary line comprising first, second and third connecting lines which are connected sequentially, the first and third connecting lines being on two sides of the intersection portion and connected with the data line, and
wherein at least one of the first, second, and third data connecting lines is formed along with the data line, with a same material as the data line and on a same layer as the data line.

10. The TFT array substrate according to claim 9, wherein the first, second and third connecting lines of the data auxiliary line are formed along with the data line, with a same material as the data line and on a same layer as the data line.

11. The TFT array substrate according to claim 9, wherein a layer on which the second connecting line is formed is different from a layer on which the first and third connecting lines are formed.

12. The TFT array substrate according to claim 11, wherein the first and third connecting lines are connected with the data line via first and second via holes, respectively, and are connected with the second connecting line respectively via third and fourth via holes.

13. The TFT array substrate according to claim 11, wherein the second connecting line is formed along with the data line, with a same material as the data line and on a same layer as the data line, the first and third connecting lines being formed along with the pixel electrode, with a same material as the pixel electrode and on a same layer as the pixel electrode.

14. The TFT array substrate according to claim 11, wherein the second connecting line is formed along with the pixel electrode, with a same material as the pixel electrode and on a same layer as the pixel electrode, the first and third connecting lines being formed along with the data line, with a same material as the data line and on a same layer as the data line.

15. The TFT array substrate according to claim 9, wherein the data auxiliary line is disposed on a side opposite to a thin film transistor of the pixel with respect to the data line.

* * * * *